US007645989B2

United States Patent
Bihr et al.

(10) Patent No.: US 7,645,989 B2
(45) Date of Patent: Jan. 12, 2010

(54) ELECTRON MICROSCOPE FOR INSPECTING AND PROCESSING OF AN OBJECT WITH MINIATURIZED STRUCTURES AND METHOD THEREOF

(75) Inventors: Johannes Bihr, Aalen (DE); Friedhelm Panteleit, Aalen (DE); Tobias Clauss, Heidenheim (DE); Michael Budach, Hanau (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 302 days.

(21) Appl. No.: 11/902,125

(22) Filed: Sep. 19, 2007

(65) Prior Publication Data

US 2008/0099674 A1    May 1, 2008

(30) Foreign Application Priority Data

Sep. 19, 2006    (DE) .................. 10 2006 043 895

(51) Int. Cl.
*G01N 23/00* (2006.01)
*G21K 7/00* (2006.01)

(52) U.S. Cl. .................... 250/311; 250/310; 250/306; 250/307

(58) Field of Classification Search ............... 250/306, 250/307, 310, 311
See application file for complete search history.

(56) References Cited

U.S. PATENT DOCUMENTS

| | | | |
|---|---|---|---|
| 4,500,790 A | 2/1985 | Bretscher et al. | |
| 4,933,552 A * | 6/1990 | Lee ................. | 850/9 |
| 5,616,921 A | 4/1997 | Talbot et al. | |
| 6,590,210 B1 | 7/2003 | Essers | |
| 6,843,927 B2 | 1/2005 | Naser-Ghodsi | |
| 7,425,701 B2 * | 9/2008 | Steigerwald et al. | 250/310 |
| 2004/0169146 A1 * | 9/2004 | Maydanich et al. | 250/363.03 |
| 2004/0245465 A1 * | 12/2004 | Steigerwald et al. | 250/310 |
| 2005/0230621 A1 | 10/2005 | Edinger et al. | |
| 2006/0284090 A1 * | 12/2006 | Koops et al. | 250/310 |
| 2007/0158588 A1 * | 7/2007 | Zhou et al. | 250/492.2 |
| 2008/0099674 A1 * | 5/2008 | Bihr et al. | 250/307 |

FOREIGN PATENT DOCUMENTS

| | | |
|---|---|---|
| DE | 44 21 517 | 1/1995 |
| DE | 198 45 329 | 9/1999 |
| DE | 102 08 043 | 9/2003 |
| DE | 103 01 579 | 7/2004 |

(Continued)

*Primary Examiner*—Bernard E Souw
(74) *Attorney, Agent, or Firm*—Bruce D Riter

(57) ABSTRACT

The disclosure relates to a method for manufacturing an object with miniaturized structures. The method involves processing the object by supplying reaction gas during concurrent directing an electron beam onto a location to be processed, to deposit material or ablate material; and inspecting the object by scanning the surface of the object with an electron beam and leading generated backscattered electrons and secondary electrons to an energy selector, reflecting the secondary electrons from the energy selector, detecting the backscattered electrons passing the energy selector and generating an electron microscopic image of the scanned region in dependence on the detected backscattered electrons; and examining the generated electron microscopic image and deciding whether further depositing or ablating of material should be carried out. The disclosure also relates to an electron microscope and a processing system which are adapted for performing the method.

19 Claims, 2 Drawing Sheets

FOREIGN PATENT DOCUMENTS

| | | |
|---|---|---|
| EP | 0 444 085 | 3/1999 |
| EP | 1 439 565 | 7/2004 |
| EP | 1 587 128 | 10/2005 |
| WO | WO 2005/036583 | 4/2005 |
| WO | WO 2005/101451 | 10/2005 |

* cited by examiner

ELECTRON MICROSCOPE FOR INSPECTING AND PROCESSING OF AN OBJECT WITH MINIATURIZED STRUCTURES AND METHOD THEREOF

CROSS REFERENCE TO RELATED APPLICATION

This application claims the benefit of priority from German Application No. 10 2006 043 895.7, filed Sep. 19, 2006, the entirety of which is incorporated herein by reference.

BACKGROUND

1. Field of Disclosure

The present disclosure relates to an electron microscope for inspecting and processing an object with miniaturized structures and to a method for manufacturing an object with miniaturized structures, which method comprises processing and inspecting the object.

2. Background Information

Electron microscopy is a long time established method for inspecting a surface of an object to be examined. In scanning electron microscopy in particular the surface of the object to be examined is scanned using a narrow electron beam. The, due to the impingement of the electron beam, electrons escaping from the object surface or electrons backscattered from the object surface backscattered are detected, to be able to create an electron microscopic image of the scanned region. Conventionally, electron microscopes exhibit the following components: an electron beam source for generating an electron beam, an electron optics for focussing the electron beam onto the object to be examined, a deflecting optics for scanning the surface of the object using the electron beam as well as at least one detector for detecting electrons backscattered at the object surface or electrons escaping from the object surface. Beside for pure inspection electron microscopes are also increasingly employed for processing miniaturized structures on an object or for manufacturing an object with miniaturized structures. Thereby, material is selectively and with high precision deposited or ablated, by supplying a reaction gas to a location of the object which location is to be processed, wherein the reaction gas is excited by the electron beam impinging onto the location of the object to be processed and becomes chemically reactive, and thus by being able to selectively deposit material or selectively ablate material at the location of the excitation at the object surface. Thereby the reaction gas is appropriately selected in dependence of the material of a miniaturized structure on a surface of the object which material is to be ablated, respectively in dependence of the material to be deposited onto the surface of the object. A particular field of application of this technique lies in the domain of mask repair for lithography. For manufacturing miniaturized structures in the domain of semi-conductor industry masks still play an outstanding role. In the context of the lithography the (photo-mask) is traversed by light, to generate on a wafer a demagnified image of the mask, which exposes a photo resist applied onto a wafer and thus defines on the wafer in subsequent processing steps structures to be generated. Consequently, defects of the mask may adversely affect the quality of the miniaturized structures generated using the mask. Since the manufacturing of masks is still time consuming and expensive, methods for mask repair are increasingly applied. Thereby, using the described electron beam induced chemical reaction, mask defects can specifically and with high precision be repaired. In a method for mask repair, as also in other methods for generating miniaturized structures, it is required, to detect an end point of material deposition, respectively material ablation, at which a sufficient amount of material was deposited, respectively was ablated. For the detection of the end point a variety of parameters may be utilized for example signals from secondary or backscattered electrons, X-rays, gas components as well as a current generated in the object.

SUMMARY

It is an object of the present disclosure to describe an exemplary electron microscope for inspecting and processing an object which electron microscope enables, also for non-conducting substrates, the recording an electron microscopic image with good material contrast and which allows a processing upon gas supply.

Furthermore, it is an object of the present disclosure to describe a method for inspecting and processing an object which also for non-contacting substrates allows a judgement of the processing status.

According to a first exemplary aspect, there is provided an electron microscope for inspecting and processing an object with miniaturized structures which object is arranged in a vacuum chamber housing a fifth vacuum space, wherein the electron microscope comprises:

an electron beam source for generating an electron beam, a focussing lens for focussing the electron beam onto the object, a secondary electron detector, a backscattered electron detector which, viewed in a direction of the electron beam, that means in direction from the electron beam source to the focussing lens, is arranged in front of the secondary electron detector spaced apart therefrom, wherein the secondary electron detector and the backscattered electron detector are arranged inside of the electron microscope between the focussing lens and the electron beam source, further an energy selector, which is arranged between the secondary electron detector and the backscattered electron detector, wherein the electron microscope, as seen in a direction from the electron beam source to the focussing lens, comprises four vacuum spaces:

A first vacuum space in which the electron beam source is arranged, a second vacuum space, which is partially separated from the first vacuum space by a first pressure stage traversed by the electron beam, a third vacuum space in which the backscattered electron detector is arranged and which is partially separated from the second vacuum space by a second pressure stage traversed by the electron beam, and a fourth vacuum space in which a surface of the secondary electron detector is arranged and which is partially separated by a third pressure stage traversed by the electron beam from the third vacuum space.

The exemplary embodiments utilize the finding, that in electron microscopy methods—in particular when primary electron beams with low energy are used—generating an electron microscopic image using backscattered electrons is of particular advantage. Further, the exemplary embodiments provide an arrangement which, in spite of an elevated gas pressure at an impingement location of the electron beam onto the object due to supply of reaction gas, enables to provide an appropriate pressure profile inside the electron microscope which enables the utilization of a backscattered electron detector with energy selector and thus a particular efficient electron microscopic image generation.

As primary electrons are denoted the electrons generated by the electron beam source before their impinging onto the object and correspondingly the energy of these electrons is called primary energy.

A further advantage of the exemplary electron microscope lies in the fact that a single signal, namely that of the backscattered electrons, is sufficient, to generate an electron microscopic image which exhibits also for non-conducting, respectively poorly conducting objects with electron optically usually only difficultly differentiable miniaturized structures a sufficiently good material contrast. This enables, in particular during mask repairs, an end point detection and in particular an automatic endpoint detection.

Upon impinging of the electron beam onto the object surface the electrons comprised in the electron beam interact with the object. In dependence of the object material, respectively object materials and the primary energy of the electron beam, secondary and backscattered electrons of a variety of energies escape. Due to their stronger interaction with the object secondary electrons exhibit a lower energy than backscattered electrons, they also escape at different angles and consequently occupy another phase space. Backscattered electrons are either elastically or inelastically scattered at the object surface and have in general yet around 50 to 80% of the energy of the primary electrons. The secondary electrons, however, exhibit only a small fraction of the primary energy.

The exemplary electron microscope exhibits two different detectors especially separated from each other, namely a backscattered electron detector and a secondary electron detector. Both detectors are arranged inside of the electron microscope and are therefore also denoted as "inlens"-detectors. Beside an efficient detection of the respective kind of electrons this arrangement additionally enables an advantageously small working distance between focussing lens and object surface.

Due to their different energy and due to the different escape angles the secondary electrons traverse a path inside the electron microscope that is largely different from the path of the backscattered electrons. Thereby, a crossover of a secondary electron beam lies closer to the object than a crossover of a beam of backscattered electrons. Due to the different energies of secondary and backscattered electrons it is possible, using an energy selector, to allow only the backscattered electrons passing to the backscattered electron detector, what turned out to be especially advantageous for the generation of the electron microscopic image. Furthermore, in particular the design of the electron microscope with four vacuum spaces provides a solution for the conflicting requirements which arise on the one band from supply of a reaction gas and an associated pressure increase in the region of the object and on the other hand from effective detecting backscattered electrons. It has in particular been achieved, to provide a sufficiently large passage cross section for the backscattered electrons into the electron microscope and thus to the backscattered electron detector, thereby concurrently also to establish a vacuum environment suitable for the backscattered electron detector.

The electron beam source can be one of the conventional electron beam sources which in general comprises an arrangement of an electrode emitting electrons, extraction electrode and anode. The electron beam source can for example comprise a thermal field emitter (TFE), a Schottky-field emitter, or also a hairpin cathode.

The focussing lens may be any suitable electron optical lens for focussing an electron beam. Preferably, the focussing lens comprises a magnetic lens with electrostatic immersion lens. This combination allows, to retard initially strongly accelerated primary electrons to a lower end energy and thus to improve the resolution of the entire electron microscope. The magnetic lens typically comprises an inner pole shoe and an outer pole shoe with an excitation coil arranged therebetween and allows the generation of a magnetic field in the region of the exit opening of the magnetic lens traversed by the electron beam. An electrostatic immersion lens comprises for example an electrode arrangement with a beam tube which traverses the inner pole shoe along the optical axis and exhibits a lower end and furthermore a terminating electrode arranged in a direction to the object spaced apart from the lower end of the beam tube. Thereby, the beam tube can advantageously be arranged substantially in a lower part of an inner space formed by the inner pole shoe, while the terminating electrode in such embodiments follows the outer pole shoe substantially in direction of the primary electron beam. However, there are arbitrary other electrode arrangements employable, to retard the primary electron beam before impinging onto the object surface.

The secondary electron detector and the backscatter detector are in preferred embodiments detectors with a detection surface arranged annularly around a beam path of primary electrons in each case. They may be formed by usual electron detectors each comprising a scintillator, a light fibre and a photo multiplier, as well known from the prior art.

The fourth vacuum space is connected to an inner space (a fifth vacuum space) of the vacuum chamber by a gas leading opening in the focussing lens which opening is traversed by the electron beam. According to an advantageous exemplary embodiment, the fourth vacuum space is also connected to the inner space of the vacuum chamber via a gas leading opening, for example arranged in a region of the third pressure stage which opening is not traversed by the electron beam. This gas leading connection provides thereby for a very small pressure difference between the fourth vacuum space and the inside of the vacuum chamber. With this arrangement it is possible, to keep the vacuum in operation in immediate neighbourhood to the object about a factor 10 lower, thus the pressure higher, than overall in the inside of the vacuum chamber, in particular with a corresponding small distance between electron microscope, respectively, if applicable, additional components, such as for gas supply, and the object. Thereby, an advantageously high gas concentration, respectively a reaction gas partial pressure, beneficially for the adsorption, can be provided in a region of impingement of the primary electron beam.

Also other arrangements of the opening, respectively gas leading connection, in the fourth vacuum space are conceivable, for example an opening spaced apart from the third pressure stage by a larger distance and thus closer to the object which for example laterally leads through the focussing lens. It is also conceivable, to provide plural openings at different locations of the fourth vacuum space.

In contrast to the electron microscopes known from the prior art which are designed for material ablation, respectively material deposition, upon supply of reaction gas, a separation of the inner space of the electron microscope from the vacuum chamber as far as possible is here just not effected, but in contrast a direct connection between the fourth vacuum space and the inner space of the vacuum chamber. The gas leading connection may for example be provided by a tube or a vacuum tight hose or the like which provide only a small resistance to the gas flow.

In a further exemplary embodiment, the third pressure stage, that means the pressure stage which partially separates the fourth vacuum space from the third vacuum space, comprises the secondary electron detector. In this embodiment the pressure stage is substantially formed by an opening in the secondary electron detector which is traversed by the electron beam. The secondary electron detector may for example comprise an annularly formed scintillator which is connected to a light fibre which is subsequently connected to a photo multiplier. Since the backscattered electrons exhibit a higher kinetic energy than the secondary electrons, the majority of backscattered electrons passes the opening in the secondary electron detector and enters thereby into the following vacuum space.

In advantageous embodiments the opening of the secondary electron detector traversed by the electron beam forms the site of the electron beam path with the smallest diameter in the corresponding vacuum space, so that a pressure difference, respectively vacuum difference, between the neighbouring vacuum spaces of at least around a factor of 2 can be achieved. In embodiments with a combination of magnetic lens and electrostatic immersion lens for example the diameters of beam tube, of the opening of the terminal electrode, and of a central drill in the magnetic lens are respectively in a way larger than a diameter of the opening of the secondary electron detector traversed by the electron beam, such that this opening forms a pressure stage and enables, to separate two neighbouring vacuum spaces in such a way, that a pressure difference, respectively vacuum difference, of at least around a factor of 2 can be achieved.

The energy selector is especially preferably arranged and adapted, such that it separates secondary electrons and backscattered electrons from each other. This enables, to separate those secondary electrons from backscattered electrons which arrive in the third vacuum space. The separation of the secondary electrons from the backscattered electrons allows an especially advantageous generation of an electron microscopic image. In particular, the electron microscopic image can be generated based on the backscattered electrons, thereby enabling a better material contrast of the imaged materials.

In particular, the energy selector can be arranged and adapted, to reflect secondary electrons. For example, the energy selector may comprise two grids parallel to each other as well as a voltage source for generating an electric field between the grids. These grids are advantageously arranged substantially parallel to a detection surface of the backscattered electron detector. Since the secondary electrons exhibit a lower kinetic energy than the backscattered electrons, the electric field generated between the two grids can be appropriately adjusted, to reflect secondary electrons, while backscattered electrons may pass through the electric field. Thus, only backscattered electrons arrive at the backscattered electron detector. Furthermore, the energy selector can be configured, such that it allows only those backscattered electrons to pass through it to the backscattered electron detector whose energy exceeds a determined threshold energy, and thus performs an energy selection of the backscattered electrons. For a given energy selector this can for example be achieved by an appropriate choice of the applied voltage respectively potential difference. In respect of material, dimensions, mesh widths, etc. the grids may be alike or different, as long as they enable the generation of an electric field of a field strength and field geometry that enables a reflecting secondary electrons and, if applicable, an appropriate selection of the backscattered electrons regarding their energy. The field strength is tuned to the kinetic energy of the secondary electrons and that of the backscattered electrons which among other things depends on the primary energy of the electron beam impinging onto the object surface, object material and geometry of the miniaturized structures and also on an orientation of the object relative to the electron microscope. By appropriate choice of the electric field strength, that means appropriate energy selection, the backscattered electron yield and thus a quality of the generated electron microscopic image, is permitted to be largely improved.

According to a preferred embodiment the first vacuum space comprises a connection to a first vacuum pump, the second vacuum space comprises a connection to a second vacuum pump different from the first vacuum pump and the third vacuum space comprises a connection to a third vacuum pump different from the first and the second vacuum pumps. This enables, to individually evacuate the different vacuum spaces especially efficiently and to provide in the corresponding vacuum space a pressure appropriate for the components arranged therein.

In some embodiments the vacuum chamber and via the vacuum chamber the fourth vacuum space have a connection to a fourth vacuum pump different from the first to third pumps. Thus, the fourth vacuum space and the vacuum chamber are evacuated by the same vacuum pump. The vacuum spaces and pressure stages of the electron microscope are preferably adapted such that in operation of the electron microscope with four vacuum pumps gas pressures in the four vacuum spaces adjacent to each other differ respectively in at least 1:10, preferably in at least 1:20, 1:50, or 1:100.

In an alternative embodiment the connections of the third vacuum space and the vacuum chamber to the fourth vacuum space are commonly connected to the third vacuum pump. Thereby, in particular, the connection of the vacuum chamber can be coupled to the connection of the third vacuum space, that means connected to it. In this embodiment the connections from the third vacuum space and vacuum chamber thus merge and are concertedly, that means as a combined connection, connected to the third vacuum pump which may be for example a turbo molecular pump. The vacuum spaces and pressure stages of this embodiment are preferably adapted such that in operation of the electron microscope gas pressures in the first, the second, and the third vacuum space respectively differ in at least 1:10, preferably in at least 1:20, 1:50, or 1:100, while gas pressures in the third and the fourth vacuum space differ in at least about 1:2.

Thus, the appropriate partitioning into different vacuum spaces as well as the accordingly designed pressure stages enable the operation of the electron microscope also upon gas supply as well as the employment of the pressure sensitive backscattered electron detector, while concurrently sufficiently large passage openings for the secondary electrons and backscattered electrons to be selected are provided.

According to another exemplary aspect there is provided a method for manufacturing an object with miniaturized structures which method comprises:

a) processing the object by supplying reaction gas to a surface of the object, and directing an electron beam onto a location to be processed at the surface of the object, to deposit material at the object or ablate material from the object; and b) inspecting the object by scanning the surface of the object, respectively a region of the surface of the object, with the electron beam and leading backscattered electrons and secondary electrons generated by the scanning electron beam to an energy selector, reflecting the secondary electrons at the energy selector, detecting backscattered electrons passing the energy selector and generating an electron microscopic image of the scanned region in dependence of the detected backscattered electrons; and c) examining the generated electron microscopic image and deciding whether further depositing or ablating of material is to be carried out.

The exemplary method can be carried out especially advantageously with the exemplary electron microscope as described herein. The considerations and elaborations described above apply in analogy to the methods described herein.

Accordingly, the leading the backscattered electrons and secondary electrons generated by the scanning electron beam to an energy selector especially preferably comprises leading the backscattered electrons and secondary electrons generated by the scanning electron beam to an energy selector in the inside of the electron microscope.

Also, the exemplary method exploits the finding, that especially for non-conducting objects, respectively poorly conducting objects, and objects with material combinations that are electron optically only difficultly distinguishable using a low primary energy of the electron beam, an electron microscopic image with sufficiently good material contrast can be achieved, if backscattered electrons are detected from which secondary electrons are separated in advance using an energy selector. When the energy selector comprises an electrode arrangement with two grids arranged parallel to each other, as described above, the reflecting secondary electrons preferably comprises a reflecting secondary electrons at an electric field generated between the grids. Thereby, as already mentioned in the context with the electron microscope, the electric field is chosen with respect to its field strength and geometry, such that secondary electrons are reflected, while backscattered electrons can pass the energy selector. Further, using the energy selector, also a selection of the backscattered electrons regarding their energy can be carried out. For example, the energy selector can thereby be configured, such that it permits only those backscattered electrons to pass to the detector whose energy exceeds a predetermined threshold energy.

The present approaches are especially advantageous in those embodiments in which electrons of the electron beam during processing and inspecting exhibit a primary energy of 5 keV or less at the location of the object, for example 2 keV or less and in particular 1 keV or less. Using such a small primary energy of the electron beam an undesired charging of the object can at least be diminished.

This primary energy thereby can be achieved by an electrostatic immersion lens or other appropriate electrode arrangements in the region of the focussing lens or between focussing lens and object, as already described above. Those arrangements not only enable retarding an electron beam to a desired primary energy, but are also advantageous for leading secondary and backscattered electrons into the inside of the electron microscope.

In a further advantageous embodiment of the method the leading the secondary electrons generated by the scanning electron beam which are not supplied to the energy selector, comprises the leading these secondary electrons to a secondary electron detector and detecting the secondary electrons supplied to the secondary electron detector. This method step permits, to gain further information about the surface of the object. The signals of the respective detectors can be correlated with each other depending on the desired information content of the electron microscopic image.

According to a further advantageous embodiment the method further comprises the generating a first vacuum in a space in which an electron detecting surface of the secondary electron detector is arranged; and generating a second vacuum in a space in which the energy selector is arranged, wherein a gas pressure of the first vacuum is at least two times, for example more than five times, more than ten, twenty or fifty times larger than a gas pressure of the second vacuum. As already described in the context with the electron microscope, such a design of the electron microscope and the method steps associated therewith enable processing the object surface upon gas supply as well as efficient detection of backscattered electrons. Furthermore, the energy selector, respectively in the case of the electrode arrangement with two grids using the electric field generated there between, the particular adjustment of the energy selector, respectively adjustment of the geometry and strength of the electric field between the grids, allows to improve a contrast between different scanned materials of an object in the generated electron microscopic image.

For example, by the improved material contrast an automatic endpoint detection during a mask repair becomes possible. In such an embodiment the examining the generated electron microscopic image and deciding whether further depositing or ablating material is to be carried out, comprises comparing a maximum value of an examined pixel of the electron microscopic image to a target value of this pixel of the examined electron microscopic image and ceasing the processing, if the difference between the actual value and the target value falls below a particular limiting value. This deciding is especially advantageous in an automatic manner for end point detection during material depositing, respectively material ablating, in the context of mask repair methods.

The generating the electron microscopic image may further comprise: Scanning the surface of the object with the electron beam for generating a first electron microscopic image in dependence of the detected backscattered electrons, rescanning the surface of the object with the electron beam for generating a second electron microscopic image of the scanned region in dependence of the detected backscattered electrons and generating an electron microscopic image from an average of the first and the second electron microscopic image. The method may further comprise n times scanning and correspondingly generating n electron microscopic images, wherein the averaged electron microscopic image is preferably an average of the n electron microscopic images. With this method a signal to noise ratio of the generated electron microscopic image is permitted to be advantageously improved. Thereby, the ratio increases in favour of the signal with the number of pixels over which is averaged.

According to a third exemplary aspect there is provided a processing system for processing an object with miniaturized structures is provided which comprises the exemplary electron microscope such as described herein as well as a gas supply arrangement for supplying a reaction gas to the object surface.

Appropriate gas supply arrangements are known from the prior art. An example for a gas supply arrangement may for example be learned from the German published document DE 102 08 043 A1.

The processing an object by supplying reaction gas for material ablation or material deposition as such is known from the prior art. Furthermore, new materials and reactions for etch and deposition processes are constantly being developed. An increased gas pressure in the region of the location to be processed at the object is on one hand due to the necessarily supplied reaction gas, on the other hand in the course of the reaction also reaction products in gas form arise which locally increase the gas pressure and must be removed from the system.

In preferred exemplary embodiments the electron microscope and/or the processing system is adapted to carry out the methods described herein. For example, the electron microscope, respectively the processing system, comprises a control unit for controlling the method steps, preferably including an optimizing a potential difference to be applied at the energy selector. Preferably, the control unit is adapted to automatically carry out the step of the deciding by comparing an actual image to a target image.

According to a preferred embodiment the processing system further comprises an electrode arrangement which comprises an electrode arranged between the focussing lens of the electron microscope and the object which electrode exhibits an opening traversed by the electron beam. This electrode serves as a shielding element and enables, to shield the primary beam in the region of its impinging from electric fields which evolve such as by charging of the object. The opening of the electrode and the electrode itself should be arranged relative to the object and sized such that it does not substantially reduce a number of secondary and backscattered electrons passing through the electrode opening in direction of the electron microscope. An appropriate electrode arrangement is for example described in the International Patent Application with publication No. WO2005/101451 A1.

In exemplary embodiments the gas supply arrangement and/or the electrode serving as shielding element may be adapted such that during processing the object an extensive sealing to the object is provided by this and/or one or more other component(s) proximate to the object such that a predominant fraction of the gas/gases present in this region, such as reaction gas and gas generated by reaction, preferably at least about 50 mass %, further preferably at least about 75 mass %, is supplied via the gas leading connection between the fourth vacuum space and the inside of the vacuum chamber to the vacuum chamber and from there is removed by a vacuum pump, while a relatively smaller fraction of the gas/gases in the region of the object escapes into the inside of the vacuum chamber.

BRIEF DESCRIPTION OF THE DRAWINGS

In the following exemplary embodiments are described with reference to the figures, wherein.

Like reference signs denote like components.

DETAILED DESCRIPTION OF EXEMPLARY EMBODIMENTS

The operating with a reactive gas in an electron microscopy arrangement otherwise operated under high vacuum as well as the processing of a mask with the particulars of materials conventionally utilized for masks make great demands on the properties of the electron microscopy system respectively processing system. Regarding the supply of a reaction gas particular requirements evolve for the vacuum pump system of the electron microscope as well as of the entire processing system, since the vacuum must not exceed a determined threshold and since additionally a sensitivity of several electron microscopy components to reactive gas must be taken into account regarding the arrangement of these components in the system. Thus, for example damages to electron microscopy components and electric flashovers caused by a too high pressure must be avoided. Further requirements arise from the fact that masks, in particular photo masks, are usually difficult to image by electron microscopy, since by the materials usually utilized for a photo mask, for example MoSi on a quartz substrate, there results only a very poor material contrast. Furthermore, problems arise due to the insufficient conductivity of masks. Quartz usually charges in the course of the electron microscopic inspection, respectively processing. Such a charging leads to a deformation and deflection of the electron beam and overall to an image drift. Furthermore, the number and distribution of the secondary electrons escaping from the object surface as well as the backscattered electrons are negatively affected by the charging of the object. Thus, according to one example, it is desired to provide an electron microscope for inspecting and processing an object which electron microscope enables, also for non-conducting substrates, the recording an electron microscopic image with good material contrast and which allows a processing upon gas supply.

Figure 1:
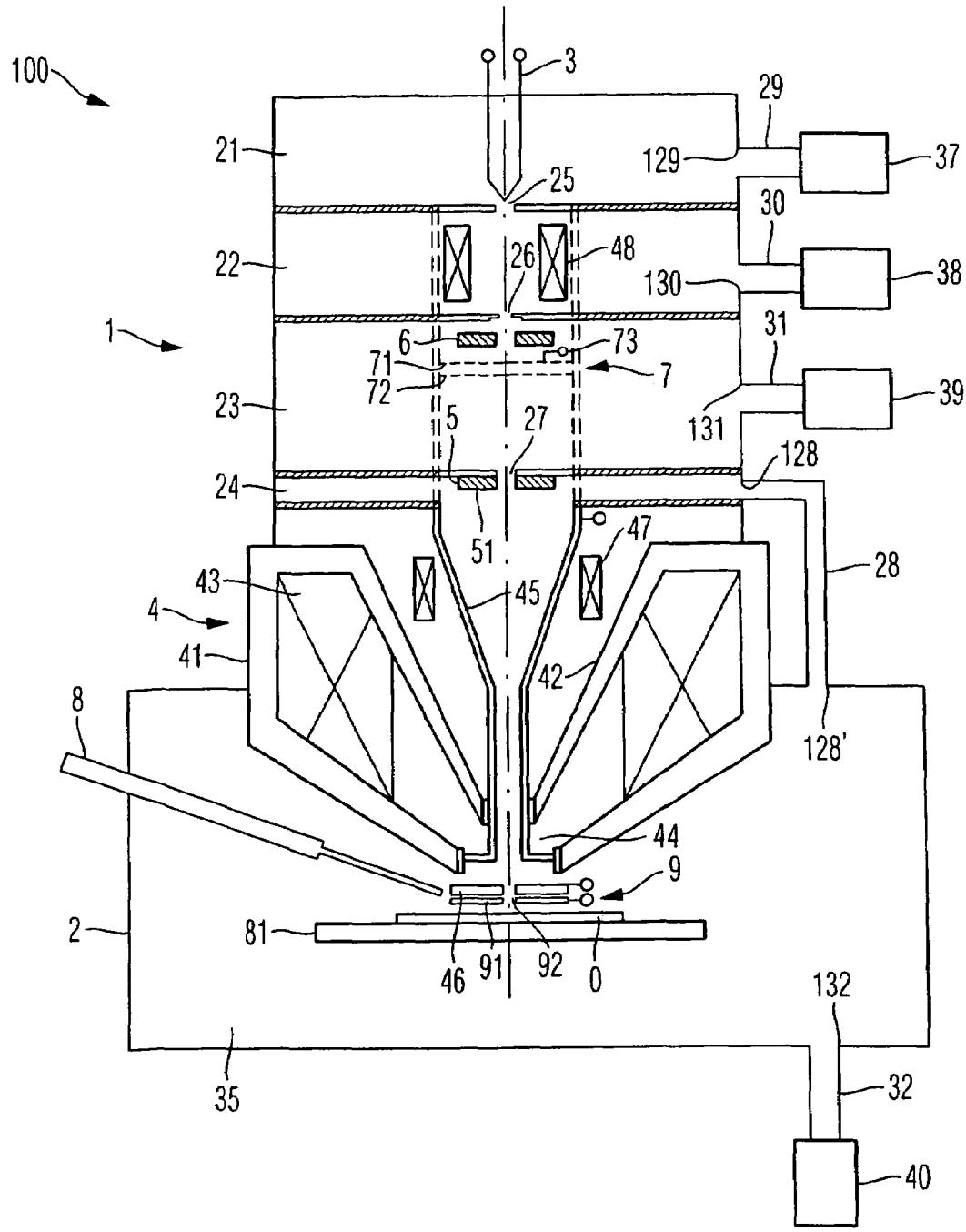
FIG. 1 illustrates a simplified schematic cross section through a first embodiment of a processing system according to one example.

With reference to FIG. 1, in a first example, the processing system 100 comprises an electron microscope 1, a gas supply arrangement 8 for supplying reaction gas to a to be processed location of an object O held on an object holder 81 as well as an electrode arrangement 9.

The electron microscope 1 comprises in a direction of the electron beam an electron beam source 3, first focussing/deflection elements 48, a backscattered electron detector 6, an energy selector 7, a secondary electron detector 5 and a focussing lens 4. Inside the focussing lens second focussing/deflection elements 47 are arranged. The focussing lens 4 is a combination of a magnetic lens and an electrostatic immersion lens. The magnetic lens comprises an inner pole shoe 42, an outer pole shoe 41, a coil 43 arranged therebetween, wherein a lower end of the inner pole shoe 42 and a lower end of the outer pole shoe 41 form a substantially axial gap 44 in which a magnetic field is generated upon induction of a magnetic flow through the pole shoes 41, 42 by current flow in the coil 43 which substantially protrudes in the region of the axial gap 44. This magnetic field causes focussing the electron beam which is accelerated from the electron beam source 3 towards the object O. The electrostatic immersion lens comprises a beam tube 45 which extends through an inner space of the magnetic lens 4 which inner space is formed by the inner pole shoe 42 and the outer pole shoe 41. The electrostatic immersion lens further comprises a terminal electrode 46 arranged spaced apart from a lower end of the beam tube 45. By applying an appropriate electric field between the beam tube 45 and the terminal electrode 46 via a voltage source (schematically indicated, without reference sign) it is possible, to retard the primary electrons to a primary energy of 1 keV appropriate for inspection of photo masks. In the illustrated embodiment the beam tube may for example lie at +8 keV, whereas the terminal electrode 46 is grounded.

The electron microscope 1 is partitioned into four different vacuum spaces 21, 22, 23, 24 which are partially separated from each other by pressure stages 25, 26, 27. A fifth vacuum space 35 housed the vacuum chamber 2 is partially separated form the fourth vacuum space. A first vacuum space 21 contains the electron beam source 3. The first vacuum space 21 is connected to an ion getter pump 37 via a first connection 29. The first vacuum space communicates with the ion getter pump via an opening 129. For example, in the first vacuum space 21 a pressure in the range from about $10^{-9}$ to $10^{-10}$ mbar prevails during an operation of the electron microscope. A first pressure stage 25 is formed by an opening 25 symmetrically surrounding the electron beam path. A second vacuum space 22 is connected to a second vacuum pump 38, an ion getter pump, via a second connection 30. The second vacuum space communicates with the ion getter pump via an opening 130. A second pressure stage partially separates the second vacuum space 22 from a third vacuum space 23. The pressure in the second vacuum space 22 may for example amount to in the range of about $10^{-7}$ mbar during operation of the electron microscope. In the third vacuum space 23 the backscattered electron detector 6 and the energy selector 7 are arranged. The third vacuum space 23 is partially separated from the second and a fourth vacuum spaces 22, 24 by pressure stages 26, respectively 27, and exhibits a connector 31 which connects the third vacuum space to a third vacuum pump 39. The third vacuum space communicates with third vacuum pump 39 via an opening 131. The pressure in the third vacuum space may for example amount to in the range of about $10^{-5}$ mbar during operation. The fourth vacuum space 24 is partially separated from the third vacuum space 23 by the third pressure stage 27. In the illustrated exemplary embodiment the third pressure stage 27 comprises the secondary electron detector 5. Thereby, an opening of the third pressure stage 27 is formed through the opening of the secondary electron detector 5 traversed by the electron beam. The secondary electron detector 5 is thereby held inside the electron microscope 1 such that a pressure balancing between the partially separated vacuum spaces 23, 24 can only occur through the opening in the secondary electron detector. A housing of the fourth vacuum space 24 comprises on opening 128 and further exhibits a gas leading connection 28 to an opening 128' to the inside (the fifth vacuum space) of the vacuum chamber 2. The gas leading connection 28 is here provided by a simple metal tube. Via the metal tube which exhibits a quite large diameter, to resist the transport of gas into the inside of the vacuum chamber 2 as little as possible, the reaction gas supplied via the gas supply is exhausted from the fourth vacuum space 24 to the vacuum chamber 2. In the illustrated exemplary embodiment the beam tube 45 exhibits a, in direction of the beam lower cylindrically shaped region which conically enlarges in direction towards the secondary electron detector 5 and extend then in form of a cylinder with larger diameter upwards through the second vacuum space 22.

Thus, the beam tube 45 surrounds secondary electron detector 5, energy selector 7 as well as backscattered electron detector 6. The beam tube 45 is held spaced apart below the secondary electron detector 5 by a vacuum tight holder 49, for example from ceramic, and is vacuum tightly connected to the lower pole shoe 41 such that the fourth vacuum space 24 substantially comprises an inner space of the beam tube and an inter space between isolation 49 and the third vacuum space 23, which follows in the direction of the electron beam source 3. During operation, in the inside of the fourth vacuum space 24 in the region of the third pressure stage 27, that means in a neighbourhood of it, a pressure prevails in the range of around some $10^{-4}$ mbar, for example while in the inside 35 of the vacuum chamber 2 a vacuum in the range of around some $10^{-5}$ mbar is reached, for example. The vacuum chamber 2 comprises on opening 132 leading to a connector 32 which lets the fifth vacuum space 35 housed by the vacuum chamber 2 to communicate with a fourth vacuum pump 40. Thus, the first, the second, the third, and the combination of the fourth vacuum space and the fifth vacuum space are permitted to be respectively individually evacuated, so that a good operation of the electron microscope also upon gas supply in the vacuum chamber is enabled.

A detection surface 51 of the secondary electron detector is therefore arranged in the fourth vacuum space 24, while the backscattered electron detector 6 is arranged in the third vacuum space 23 in which a better vacuum is reached. The energy selector 7 is arranged in front of the backscattered electron detector 6 such that all electrons emitted from the object O or backscattered therefrom must pass the energy selector 7, to be able to arrive at a detection surface of the backscattered electron detector 6. The energy selector 7 comprises in the illustrated embodiment a first grid 71, a second grid 72, and a voltage source 73 for generating an appropriate electric field between the first and the second grid, to enable the reflecting of secondary electrons escaped from the object surface. The grids are arranged parallel to each other and surround the electron beam path of the primary electron beam generated from the electron beam source 3 annularly. In the exemplary illustrated embodiment the first grid 71 is connected to the voltage source 73, while the second grid 72 is coupled to the beam tube 45 and thus lies at the same potential as the beam tube. It is possible, to introduce an isolating tube into the opening formed by the grids 71, 72 which opening is traversed by the electron beam, to protect the primary electron beam from the influence of the electric field applied between the two grids 71, 72. The electric field applied using the voltage source 73 is adapted to the primary electron energy and the particulars of the inspected and processed sample such that the backscattered electrons pass through the electric field therethrough and are detected at the backscattered electron detector, while the secondary electrons due to their lower kinetic energy are reflected and are therefore not detected. By adjustment of the potential difference applied at the grids it is permitted to improve height of the electric field and thus height of the detection signal.

As shown in FIG. 1, an electrode arrangement 9 comprises a shielding electrode 91 arranged annularly around the electron beam path which shielding electrode exhibits a central opening 92 which enables undisturbed transmission of the primary electron beam and largely unhampered transmission of secondary and backscattered electrons. To the electrode 91 an appropriate voltage can be applied using an appropriate voltage source (schematically indicated, without reference sign), to effectively shield the primary electron beam from an electric field generated by charging the object O.

In a method for automatic end point detection in a first step inspecting the object is carried out which for the mask repair is a photo mask in which for example miniaturized molybdenum structures on a quartz substrate are applied. During inspecting defects in the mask are identified and processing steps for eliminating, respectively correcting, the deflects are chosen. Then, in a processing step, a location to be processed on the object O is brought into the region of the primary electron beam and a reaction gas is supplied using the gas supply arrangement 8 which is excited by the electrons of the electron beam and thus becomes chemically reactive. Therewith material can be ablated for example. After a certain time period of ablating material the processed location is again inspected. The inspecting is carried out by detection of backscattered electrons from which secondary electrons were separated using the energy selector 7. Secondary electrons escaping from the surface of the object O enter into the inside of the electron microscope 1 and impinge in the fourth vacuum space onto the detection surface 51 of the secondary electron detector 5. Those secondary electrons which penetrate through the opening of the secondary electron detector into the third vacuum chamber are reflected by applying an appropriate voltage between the first grid 71 and the second grid 72 of the energy selector 7. Only the backscattered electrons having higher energy pass the energy selector 7 and arrive at the backscattered electron detector 6. The electron microscopic image based on which the achievement of an end point is decided is generated based on the detected backscattered electrons. If the generated electron microscopic image corresponds to a target image, the processing the object can be ceased. Otherwise a new processing step is carried out upon supply of reaction gas. This kind of method enables in an especially advantageous manner an automatic end point detection in particular for the repair of photo masks.

Figure 2:
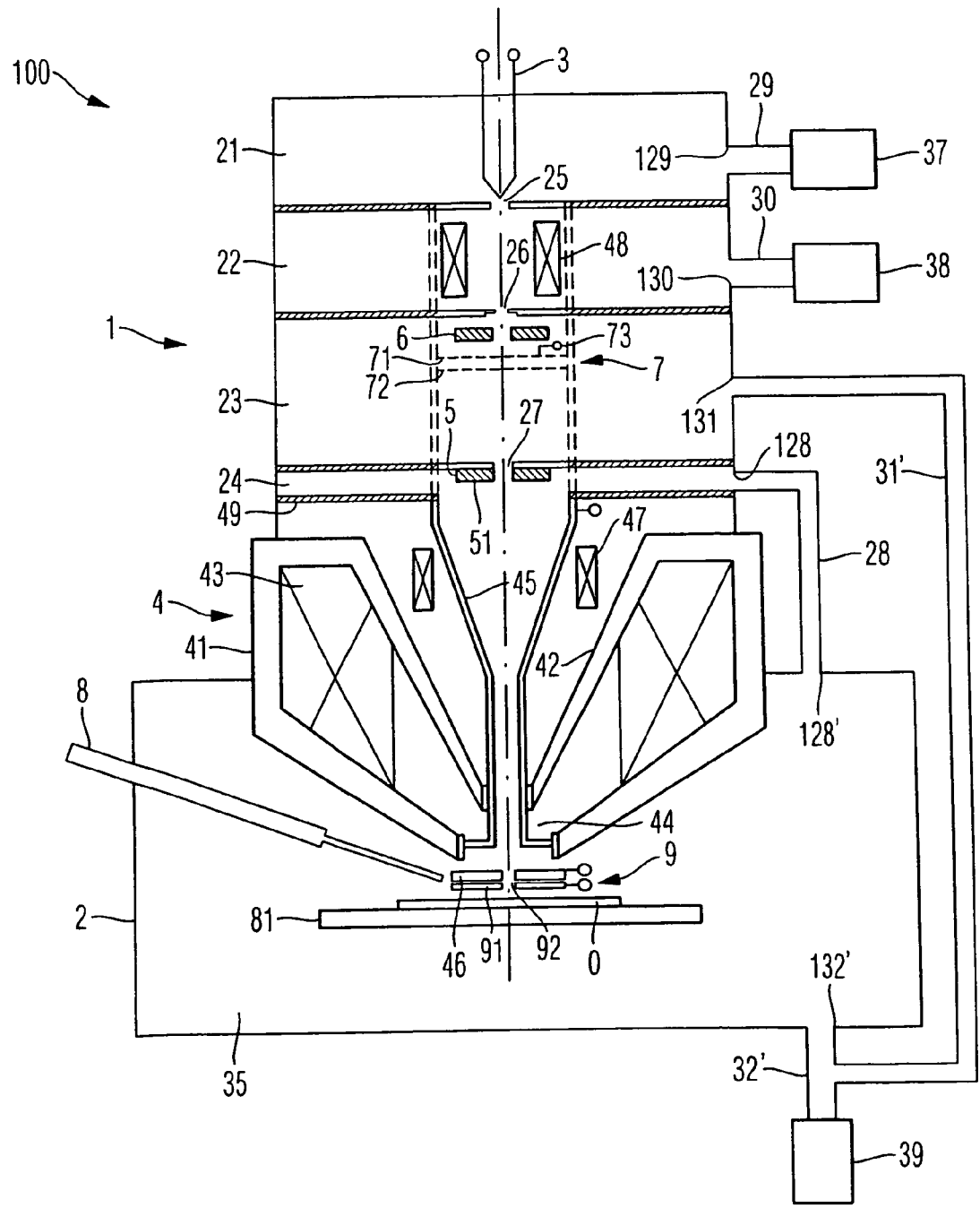
FIG. 2 illustrates a simplified, schematic cross section through a second embodiment of a processing system according to another example.

FIG. 2 illustrates a second exemplary embodiment, which differs from the first embodiment in connections and association with vacuum pumps of the third and fourth vacuum spaces 23, 24. In the example of FIG. 2, a connection 31' of the third vacuum space 23 merges with a connection 32' of the vacuum chamber 2. Thus, the third vacuum space 23, the vacuum chamber 2 and via the latter the fourth vacuum space 24 are connected to the same third pump 39. Hereby, the fifth vacuum space 35 communicates with the vacuum pump 39 via an opening 132'. Also with this instrumentally a less elaborate implementation it is permitted, to generate an appropriate vacuum environment inside the electron microscope. During operation in the first vacuum space 21 a vacuum in the range of around $5*10^{-10}$ mbar prevails and a vacuum in the second vacuum space 22 in the range of around $5*10^{-8}$ mbar prevails. A vacuum in the third vacuum space 23 and in the connection 31' of around $7*10^{-5}$ mbar prevails, for example. In the region of the third pressure stage 27 in the inside of the fourth vacuum space 24 and in the inside of the vacuum chamber 2 a pressure during operation in the range of around $10^{-4}$ mbar prevails, for example, while in immediate proximity to the object a vacuum in the range of only around $10^{-2}$ mbar prevails, for example.

What is claimed is:

1. A method of manufacturing an object having miniaturized structures, the method comprising:
   (a) processing the object by
      supplying process gas to a surface of the object, and
      directing an electron beam to a processing location on the surface of the object; for at least one of depositing material on the object and ablating material from the object; and
   (b) inspecting the object by
      scanning the surface the object with the electron beam and supplying backscattered electrons and secondary electrons, generated by the scanning electron beam, to an energy selector,
      reflecting the secondary electrons at the energy selector,
      detecting backscattered electrons having traversed the energy selector, and
      generating an electron microscopic image of the scanned surface based on the detected backscattered electrons; and
   (c) performing one of
      (i) repeating the processing and the inspecting of the object, and
      (ii) stopping further processing and inspecting of the object,
      based on an analysis of the generated electron microscopic image of the object.

2. The method according to claim 1, wherein the energy selector comprises two grid electrodes disposed at a distance from each other, and wherein the reflecting of the secondary electrons comprises reflecting the secondary electrons by an electric field generated between the grid electrodes.

3. The method according to claim 1, wherein electrons of the electron beam have, at the surface of the object, a kinetic energy of less than 5 keV.

4. The method according to claim 1, further comprising supplying secondary electrons generated by the scanning electron beam, which are not supplied to the energy selector, to a secondary electron detector, and detecting the secondary electrons supplied to the secondary electron detector.

5. The method according to claim 1, further comprising generating a fourth vacuum in a space in which an electron detecting surface of the secondary electron detector is disposed, and generating a third vacuum in a space in which the energy selector is disposed, and
   maintaining, during the processing of the object, a ratio of a gas pressure of the third vacuum and a gas pressure of the fourth vacuum of less than 1:2.

6. The method according to claim 5, further comprising generating a second vacuum in a space disposed between a space in which an electron beam source is disposed and the space in which the energy selector is disposed, generating a first vacuum in a space in which the electron beam source is disposed, and
   maintaining, during the processing of the object,
   a ratio of a gas pressure of the first vacuum and a gas pressure of the second vacuum, and
   a ratio of the gas pressure of the second vacuum and a gas pressure of the third vacuum,
   to be each smaller than 1:10.

7. A processing system for inspecting and processing of an object having miniaturized structures, the electron microscopy system comprising:
   an electron beam source for generating an electron beam;
   a focussing lens for focussing the electron beam onto the object;
   a secondary electron detector disposed at a distance from the object;
   an energy selector disposed at a greater distance from the object than the secondary electron detector;
   a backscattered electron detector disposed at a greater distance from the object than the energy selector;
   a first vacuum space in which the electron beam source is disposed;
   a second vacuum space which is partially separated from the first vacuum space by a first separating structure comprising an aperture traversed by the electron beam;
   a third vacuum space in which the backscattered electron detector is disposed, wherein the third vacuum space is partially separated from the second vacuum space by a second separating structure (26) comprising an aperture traversed by the electron beam; and
   a fourth vacuum space in which a surface of the secondary electron detector is disposed, wherein the fourth vacuum space is partially separated from the third vacuum space by a third separating structure (27) comprising an aperture traversed by the electron beam.

8. The processing system according to claim 7, wherein the third separating structure comprises the secondary electron detector.

9. The processing system according to claim 7, wherein the energy selector is configured to separate secondary electrons and backscattered electrons from each other.

10. The processing system according to claim 9, wherein the energy selector is configured to reflect the secondary electrons.

11. The processing system according to claim 9, wherein the energy selector is configured such that only backscattered electrons having a kinetic energy above a predetermined threshold energy are allowed to reach at the backscattered electron detector.

12. The processing system according to claim 7, wherein the energy selector comprises two grid electrodes disposed at a distance from each other, and a voltage source for generating an electric field between the two grid electrodes.

13. The processing system according to claim 7, further comprising a gas supply arrangement for supplying a reaction gas to a surface of the object.

14. The processing system according to claim 7, further comprising first, second and third vacuum pumps,
- wherein a housing of the first vacuum space comprises an opening communicating with the first vacuum pump,
- wherein a housing of the second vacuum space comprises an opening communicating with the second vacuum pump,
- wherein a housing of the third vacuum space comprises an opening communicating with the third vacuum pump.

15. The processing system according to claim 7, further comprising a fifth vacuum space in which the object is disposed,
- wherein a housing of the fourth vacuum space comprises an opening not traversed by the electron beam,
- wherein a housing of the fifth vacuum space comprises an opening not traversed by the electron beam and communicating with the opening of the fourth vacuum space.

16. The processing system according to claim 15, further comprising a fourth vacuum pump different from the first, second and third vacuum pumps, wherein the housing of the fifth vacuum space comprises an opening communicating with the fourth vacuum pump.

17. The processing system according to claim 15, wherein the fifth vacuum space comprises an opening communicating with the third vacuum pump.

18. The processing system according to claim 7, wherein the electron microscopy system is configured such that, during operation,
- a ratio of a gas pressure in the first vacuum space and a gas pressure in the second vacuum space, and
- a ratio of the gas pressure in the second vacuum space and a gas pressure in the third vacuum space are each smaller than 1:10.

19. The processing system according to claim 7, wherein the electron microscopy system is further configured such that, during operation,
- a ratio of the gas pressure in the third vacuum space and a gas pressure in the fourth vacuum space is smaller than 1:2.

* * * * *